US009281430B2

(12) United States Patent
Carolan et al.

(10) Patent No.: US 9,281,430 B2
(45) Date of Patent: Mar. 8, 2016

(54) COMPOSITE INSULATING PANEL

(71) Applicant: Kingspan Holdings (IRL) Limited, Kingscourt (IE)

(72) Inventors: James Carolan, Kingscourt (IE); Gregory Flynn, Collon (IE)

(73) Assignee: Kingspan Holdings (IRL) Limited, Kingscourt, County Cavan (IE)

( * ) Notice: Subject to any disclaimer, the term of this patent is extended or adjusted under 35 U.S.C. 154(b) by 0 days.

(21) Appl. No.: 14/095,161

(22) Filed: Dec. 3, 2013

(65) Prior Publication Data
US 2014/0150357 A1 Jun. 5, 2014

(30) Foreign Application Priority Data

Dec. 3, 2012 (EP) ...................................... 12195237
Dec. 3, 2012 (IE) ...................................... 2012/0521

(51) Int. Cl.
| | |
|---|---|
| *E04D 13/18* | (2014.01) |
| *H01L 31/048* | (2014.01) |
| *E04D 3/35* | (2006.01) |
| *H02S 20/23* | (2014.01) |
| *H02S 40/34* | (2014.01) |
| *F24J 2/51* | (2006.01) |
| *F24J 2/52* | (2006.01) |

(52) U.S. Cl.
CPC ............ *H01L 31/0482* (2013.01); *E04D 3/352* (2013.01); *H02S 20/23* (2014.12); *H02S 40/34* (2014.12); *F24J 2/51* (2013.01); *F24J 2/5228* (2013.01); *Y02B 10/12* (2013.01); *Y10T 29/49355* (2015.01)

(58) Field of Classification Search
USPC ........ 52/173.3, 745.19, 746.11, 309.8, 309.9, 52/794.1; 29/897.32, 897.3, 527.1; 126/621–623; 136/244, 251
See application file for complete search history.

(56) References Cited

U.S. PATENT DOCUMENTS

| | | | | |
|---|---|---|---|---|
| 3,025,198 A | * | 3/1962 | Dunn | 428/172 |
| 4,324,231 A | * | 4/1982 | Reinert | 126/674 |
| 4,378,789 A | * | 4/1983 | Vironneau | 126/654 |
| 4,383,130 A | * | 5/1983 | Uroshevich | 136/261 |
| 4,389,533 A | * | 6/1983 | Ames | 136/248 |
| 4,582,953 A | * | 4/1986 | Nagase et al. | 136/259 |
| 4,607,132 A | * | 8/1986 | Jarnagin | 136/248 |
| 4,674,244 A | * | 6/1987 | Francovitch | 52/173.3 |

(Continued)

FOREIGN PATENT DOCUMENTS

DE 20308205 U1 * 9/2003
EP 1371918 A2 * 12/2003
(Continued)

*Primary Examiner* — Brian Glessner
*Assistant Examiner* — Gisele Ford
(74) *Attorney, Agent, or Firm* — Harness, Dickey & Pierce, P.L.C.

(57) ABSTRACT

A method for manufacturing a composite insulated panel (1) comprising the steps of: providing a first sheet (2); cutting a hole (7) in the first sheet (2) to accommodate a photovoltaic solar collector module (8); inserting the solar collector module (8) into the cut-out hole; sealing the solar collector module to the first sheet (2); providing a second sheet (3), the second sheet having an opening therein to receive a connector housing (22); leading electrical connections from the solar collector module through the connector housing; and providing a body (4) of insulating material between the inner face of the second sheet and the inner face of the first sheet and the inner face of the photovoltaic solar collector module.

13 Claims, 5 Drawing Sheets

(56) References Cited

U.S. PATENT DOCUMENTS

| | | | |
|---|---|---|---|
| 4,886,554 A * | 12/1989 | Woodring et al. | 136/244 |
| 5,036,833 A * | 8/1991 | Quigley et al. | 126/621 |
| 5,289,999 A * | 3/1994 | Naujeck et al. | 244/172.7 |
| 5,316,592 A * | 5/1994 | Dinwoodie | 136/244 |
| 5,589,006 A * | 12/1996 | Itoyama et al. | 136/248 |
| 6,046,399 A * | 4/2000 | Kapner | 136/244 |
| 6,148,570 A * | 11/2000 | Dinwoodie et al. | 52/173.3 |
| 6,360,497 B1 * | 3/2002 | Nakazima et al. | 52/173.3 |
| 6,399,412 B1 * | 6/2002 | Asai et al. | 438/63 |
| 7,297,867 B2 * | 11/2007 | Nomura et al. | 136/251 |
| 7,810,286 B2 * | 10/2010 | Eiffert et al. | 52/173.3 |
| 7,834,265 B2 * | 11/2010 | Schmidt | 136/251 |
| 8,859,880 B2 * | 10/2014 | Wieting | 136/244 |
| 2002/0112419 A1 | 8/2002 | Dorr et al. | |
| 2007/0095388 A1 * | 5/2007 | Mergola et al. | 136/251 |
| 2010/0146878 A1 * | 6/2010 | Koch et al. | 52/173.3 |
| 2010/0229917 A1 * | 9/2010 | Choi et al. | 136/244 |
| 2011/0036027 A1 * | 2/2011 | Back et al. | 52/172 |
| 2011/0041888 A1 | 2/2011 | Levine | |
| 2011/0048507 A1 * | 3/2011 | Livsey et al. | 136/251 |
| 2011/0162290 A1 * | 7/2011 | Nightingale et al. | 52/27 |
| 2011/0220168 A1 * | 9/2011 | Park | 136/244 |
| 2011/0265785 A1 * | 11/2011 | Klier et al. | 126/628 |
| 2012/0048347 A1 * | 3/2012 | Yang et al. | 136/251 |
| 2012/0096781 A1 * | 4/2012 | Romesburg | 52/173.3 |
| 2012/0118360 A1 * | 5/2012 | Maeda et al. | 136/251 |
| 2012/0125395 A1 * | 5/2012 | Bellacicco et al. | 136/244 |
| 2012/0151855 A1 * | 6/2012 | Malpas | 52/173.3 |
| 2012/0186633 A1 * | 7/2012 | Carolan et al. | 136/251 |
| 2012/0233940 A1 * | 9/2012 | Perkins et al. | 52/173.3 |
| 2012/0247721 A1 * | 10/2012 | Naneff et al. | 165/47 |
| 2012/0291839 A1 * | 11/2012 | Yang et al. | 136/244 |
| 2014/0174508 A1 * | 6/2014 | Sznerski et al. | 136/251 |

FOREIGN PATENT DOCUMENTS

| | | | |
|---|---|---|---|
| EP | 1548202 A2 * | 6/2005 | |
| GB | 2340993 A * | 3/2000 | |
| GB | 2460762 A * | 12/2009 | |
| GB | 2477012 A * | 7/2011 | |
| GB | 2488902 A | 9/2012 | |
| WO | WO 9602947 A1 * | 2/1996 | |

\* cited by examiner

COMPOSITE INSULATING PANEL

With increasing energy costs there is a need for a more thermally efficient system for cladding a building.

Various attempts have been made to provide composite insulation panels with photovoltaic material applied. For example, US2002/0112419A describes planar photovoltaic elements which are bonded using a cold bonding adhesive to a cover plate of a panel This invention is directed towards providing an improved insulating panel with a photovoltaic solar collector.

STATEMENTS OF INVENTION

According to the invention there is provided a in another aspect the invention provides a method for manufacturing a composite insulated panel comprising the steps of:

- providing a first sheet;
- cutting a hole in the first sheet to accommodate a photovoltaic solar collector module;
- inserting the solar collector module into the cut-out hole;
- sealing the solar collector module to the first sheet;
- providing a second sheet, the second sheet having an opening therein to receive a connector housing;
- leading electrical connections from the solar collector module through the connector housing; and
- providing a body of insulating material between the inner face of the second sheet and the inner face of the first sheet and the inner face of the photovoltaic solar collector module.

In one embodiment the body of insulation material is provided by injecting liquid foam reactants between the inner faces of the second sheet, the first sheet and the solar collector module.

In some cases, the method comprises the steps of profiling the side edges of the external sheet to form a first longitudinally extending raised projection at one side of the panel and a second longitudinally extending raised projection at an opposite side of the panel leaving a substantially flat portion extending between the first and second raised projections and mounting the solar collector module in a cut-out opening in the substantially flat portion.

A further embodiment comprises a composite insulating panel manufactured according to the method described above, comprising:

- a first or external sheet having a cut-away opening therein, the first sheet having
  an inner face and an outer face;
- a second or internal sheet having an inner face and an outer face;
- a photovoltaic solar collector module mounted in the opening in the first sheet,
  the module having an inner face and an outer face; and
- a body of insulating material between inner face of the second sheet, the inner face of the first sheet and the inner face of the photovoltaic solar collector module.

In one embodiment the first sheet comprises a substantially flat portion and the photovoltaic solar collector module is mounted in a cut-away opening in the flat portion of the external sheet. In this case preferably the outer face of the solar collector module is substantially co-planar with the outer face of the flat portion of the first sheet.

In one embodiment the first sheet comprises a plurality of spaced-apart cut-away openings, each having a photovoltaic solar collector module mounted therein. The openings may be longitudinally spaced-apart along the panel and/or transversely spaced-apart across the panel.

The photovoltaic solar collector modules may be electrically interconnected. There may be terminals for connecting to an inverter. In one case the terminals are provided in a housing which extends through the second sheet of the composite panel.

In one embodiment the first sheet has a first longitudinally extending raised projection at one side of the panel and a second longitudinally extending raised projection at an opposite side of the panel. The first raised projection may comprise a side underlap projection and the second raised projection may comprise a side overlap projection for jointing adjacent panels.

In one case the first sheet comprises a male projecting part and a female recess part for jointing adjacent panels.

In some embodiments the second sheet comprises a male projecting part and a female recess part for jointing adjacent panels.

The insulating body comprises a foam such as a polyisocyanurate foam material or a phenolic foam material.

In one embodiment the first sheet comprises a metallic material such as a steel material.

In one embodiment the second sheet comprises a metallic material such as a steel material.

The panel in some cases is a roof panel.

The invention also provides a roof assembly comprising a plurality of panels of the invention.

BRIEF DESCRIPTION OF THE DRAWINGS

The invention will be more clearly understood from the following description of an embodiment thereof, given by way of example only, with reference to the accompanying drawings, in which.

DETAILED DESCRIPTION

Figure 1:
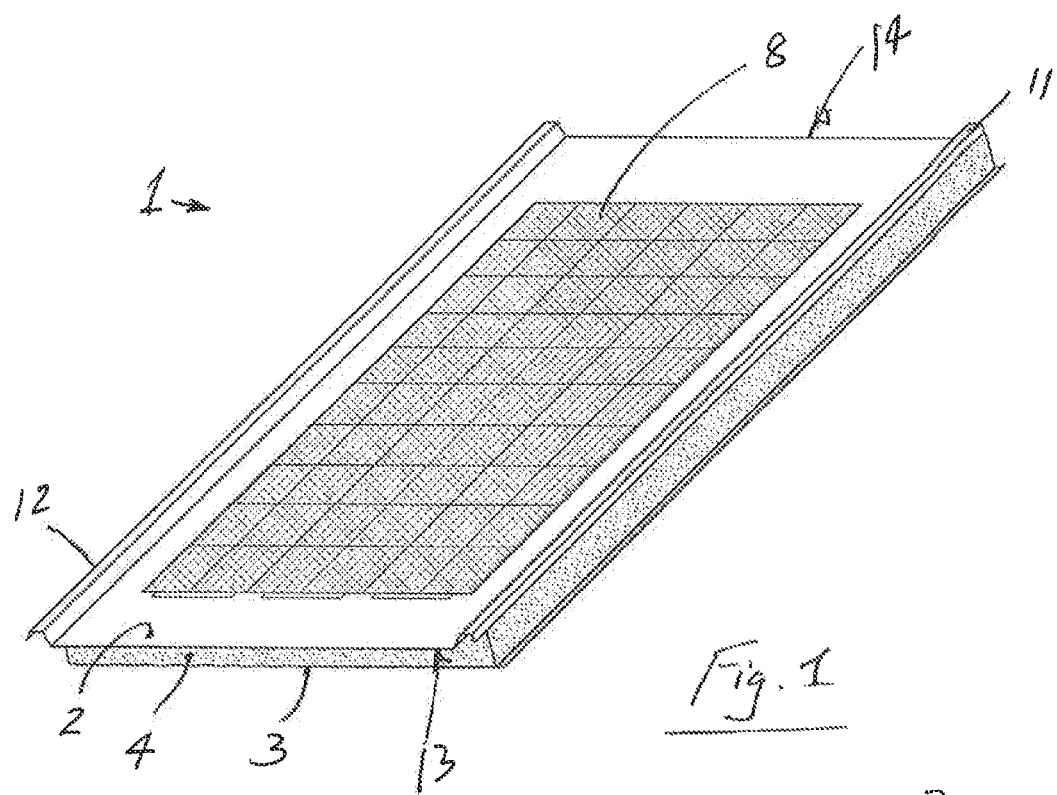
FIG. 1 is an isometric view, from above, of a composite insulating panel according to the invention.
Figure 2:
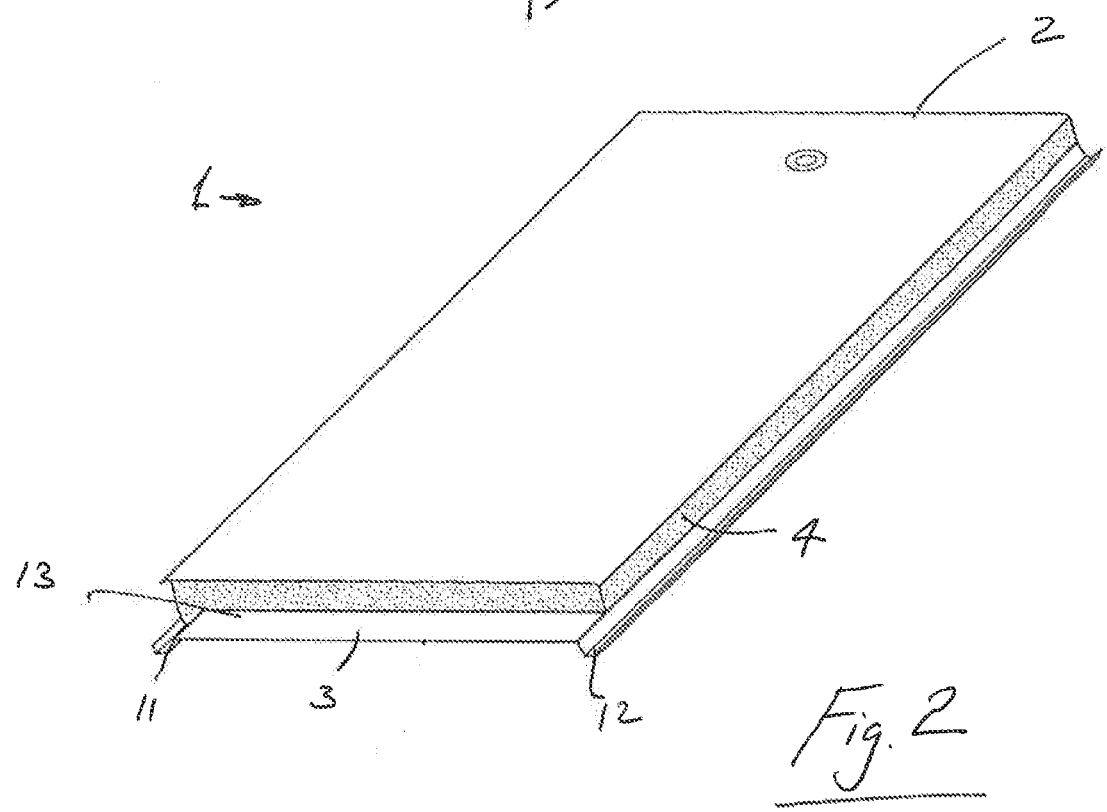
FIG. 2 is an isometric view, from below, of the panel of FIG. 1.
Figure 3:
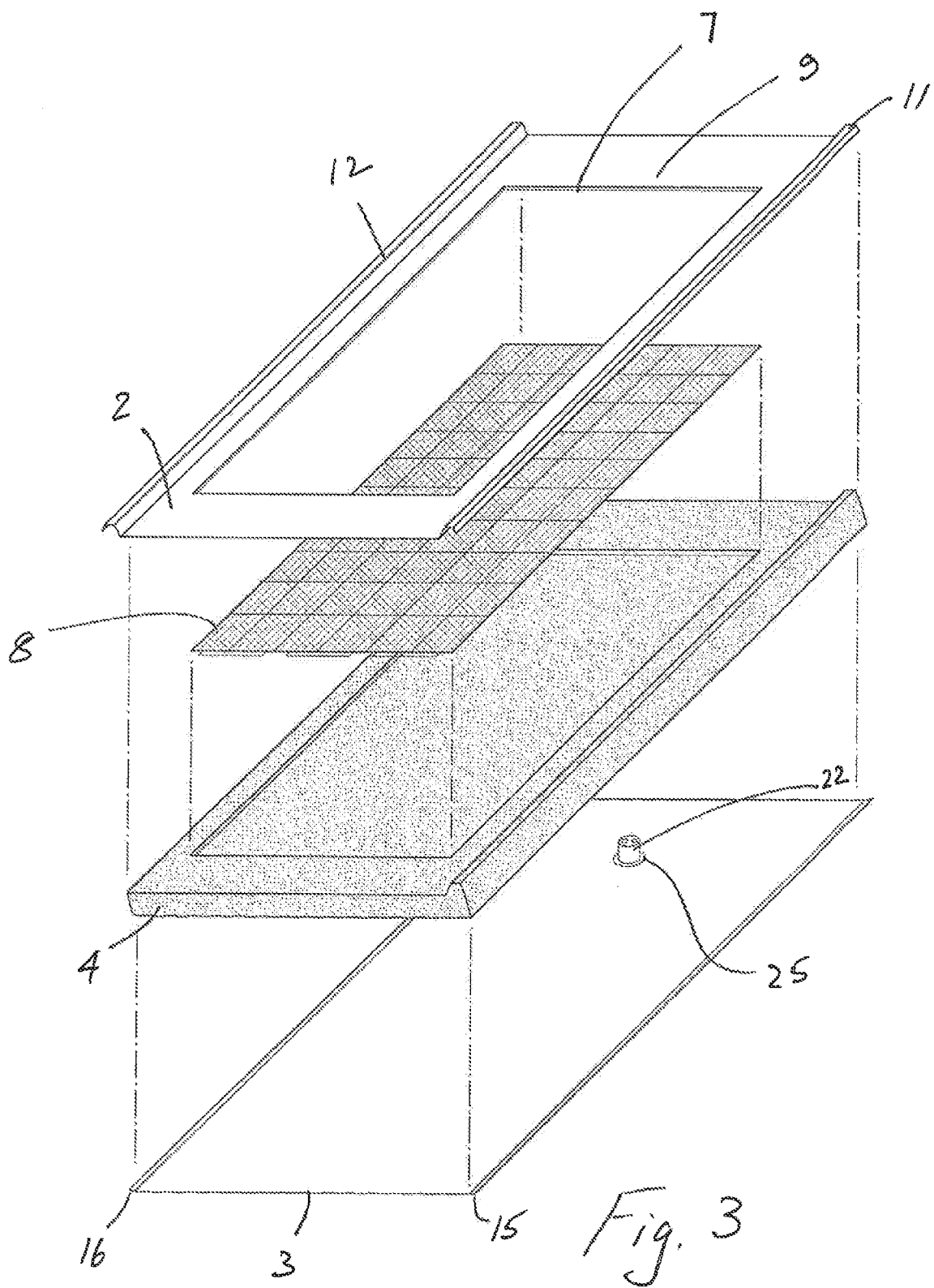
FIG. 3 is an exploded view of the panel.
Figure 4:
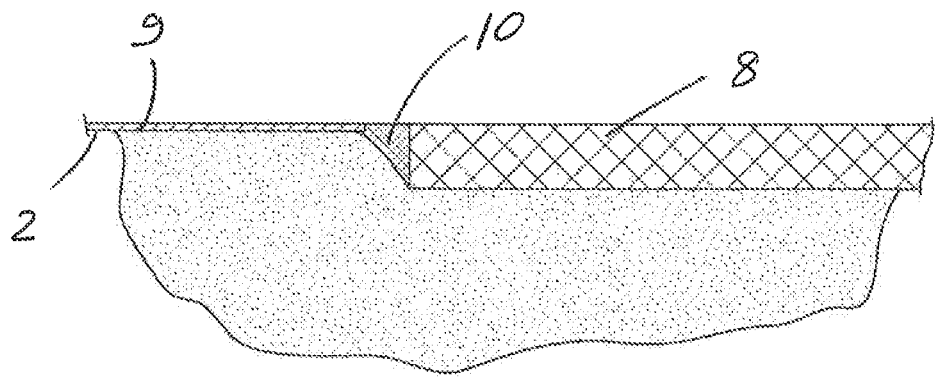
FIG. 4 is an enlarged cross sectional view of a sealing detail of the panel.
Figure 5:
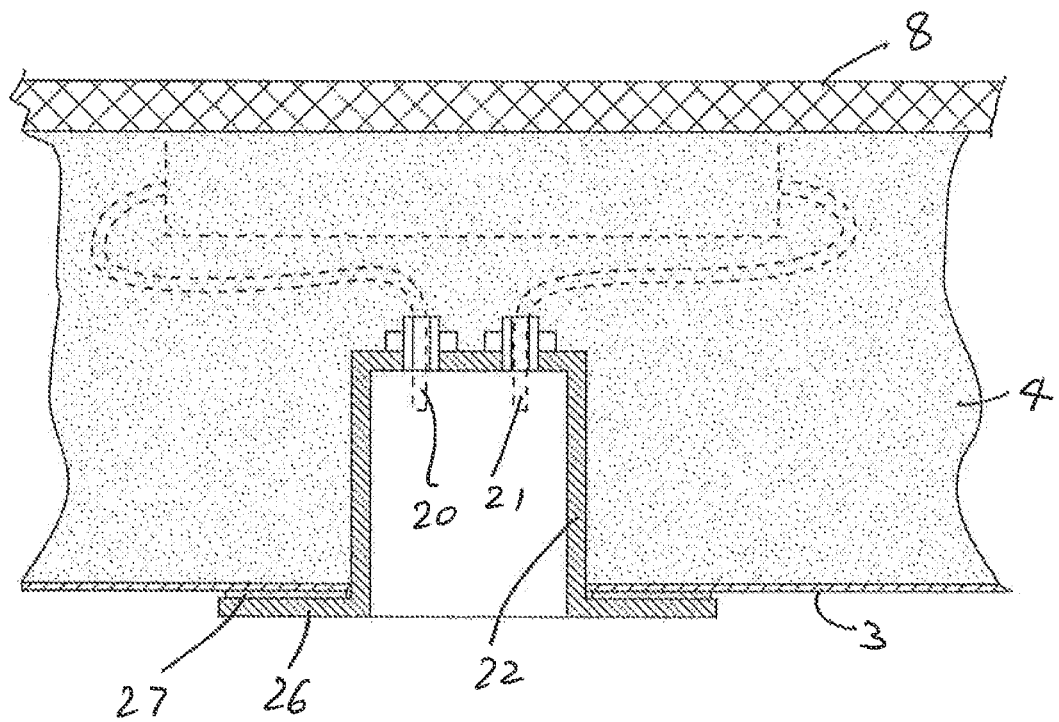
FIG. 5 is an enlarged cross sectional view of a connector and housing part of the panel.

Referring to the drawings there is illustrated an insulating panel 1 according to the invention which in this case comprises a first or external sheet 2, a second or inner sheet 3 with an insulating body, in this case an insulating foam 4 therebetween. The foam may, for example be of polyisocyanurate foam or a phenolic foam. In this case the panel 1 is a roof panel 1 and the external sheet 2 and the internal sheet 3 are of metal, such as galvanised and/or painted steel.

The external sheet 2 has a cut-away rectilinear opening 7 therein and a photovoltaic solar collector module 8 which may be of any suitable type such as amorphous silicon or crystalline silicon material is mounted in the opening 7 in the external sheet 1. The body 4 of insulating material extends between inner face of the internal sheet 3 and the inner faces of the external sheet 2 and the photovoltaic solar collector module 8.

The outer face of the solar collector module 8 is preferably substantially co-planar with the outer face of the external sheet 2 to provide a flat surface for run-off of debris/weather. A small gap is provided between the module and the adjacent edges of the external sheet 2. The gap allows for minor movements as a result of thermal expansion/contraction. The gap is filled with a suitable flexible seal 10 such as a silicone sealant.

The external sheet 2 has a first longitudinally extending raised projection 11 at one side of the panel and a second longitudinally extending raised projection 12 on the opposite side of the panel. The external sheet 2 has a substantially flat portion 9 which extends between the first and second raised projections 11, 12. Preferably the flat portion 9 extends completely between the raised projections 11, 21 on the sides of the panel in order to maximise the area to which photovoltaic material is provided and exposed to sunlight. In this way the solar energy collecting efficiency of the panel is enhanced.

The raised projections 11, 12 are in the form of crowns which in this case are of generally-trapezoidal form and extend longitudinally along the length of the panel. There is a side underlap projection or crown 11 on one side of the upper sheet 2 and a side overlap projection or crown 12 on the opposite side of the panel. The projection 12 extends beyond the internal sheet 3 and the insulating body 4 to define a side overlap for overlapping with the raised projection 11 of an adjacent panel. In use, adjacent like panels are overlapped by overlapping the overlap crown 12 of one panel with the underlap crown 11 of an adjacent panel. In this case the panel also has an end underlap portion 13 and an end overlap feature 14 for end lapping of adjacent like panels.

The panel may have engagement formations in the form of recesses 15 and projections 16 for engagement of adjacent like panels. The interengagement features 15, 16 are in this case provided by the internal sheet 3 but may be provided by either the external panel sheet and/or the internal panel sheet. Interengagement features may be provided on any of the panels of the invention.

Figure 6:
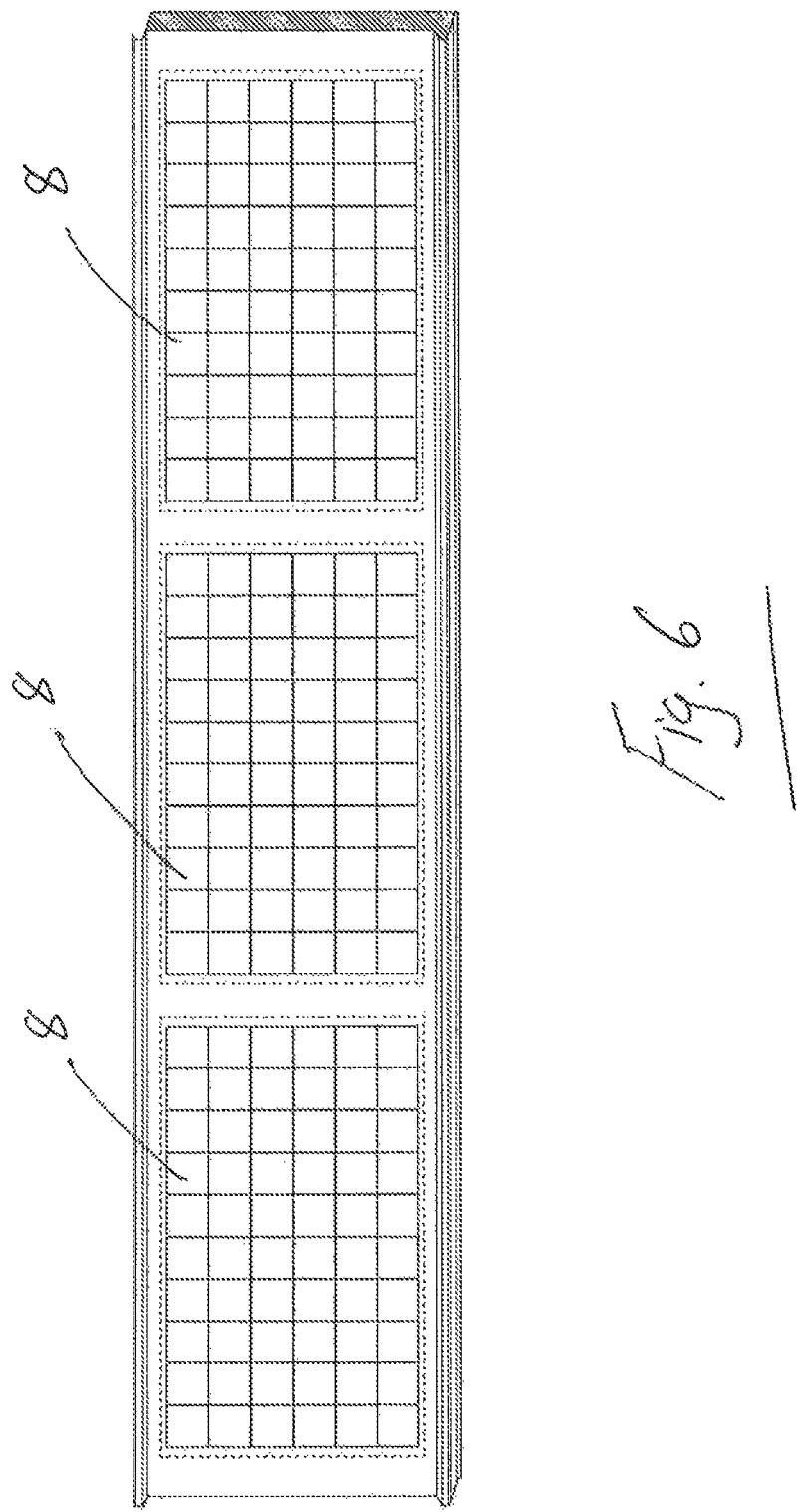
FIG. 6 is an isometric view of another panel of the invention.
Figure 7:
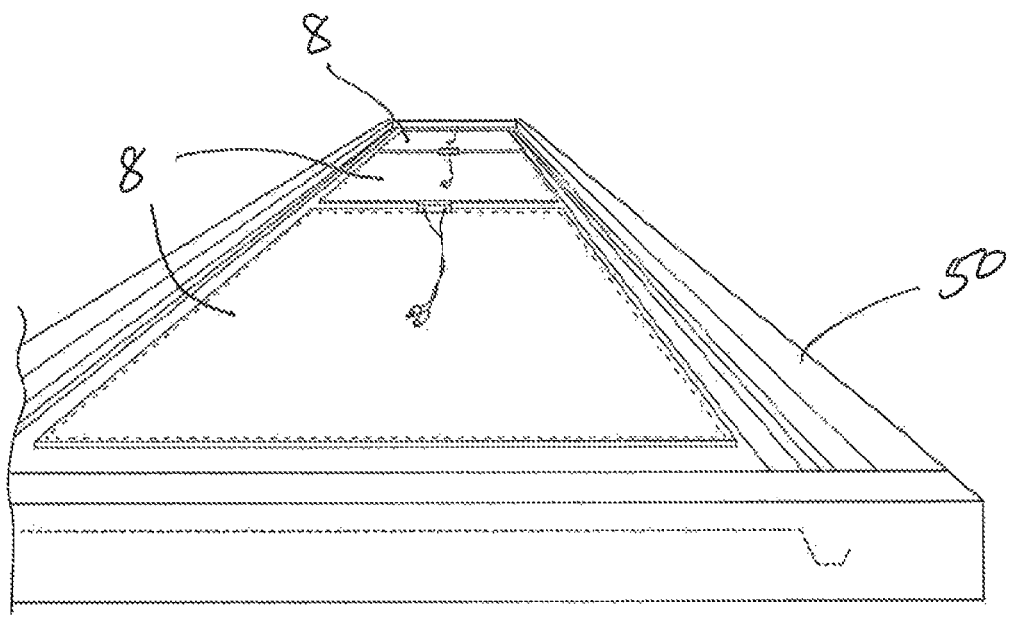
FIGS. 7 to 9 illustrate steps in the manufacture of the panel of FIG. 6.
Figure 9:
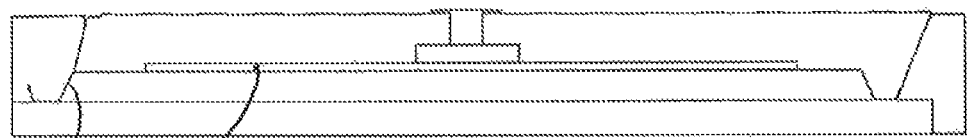
Figure 8:
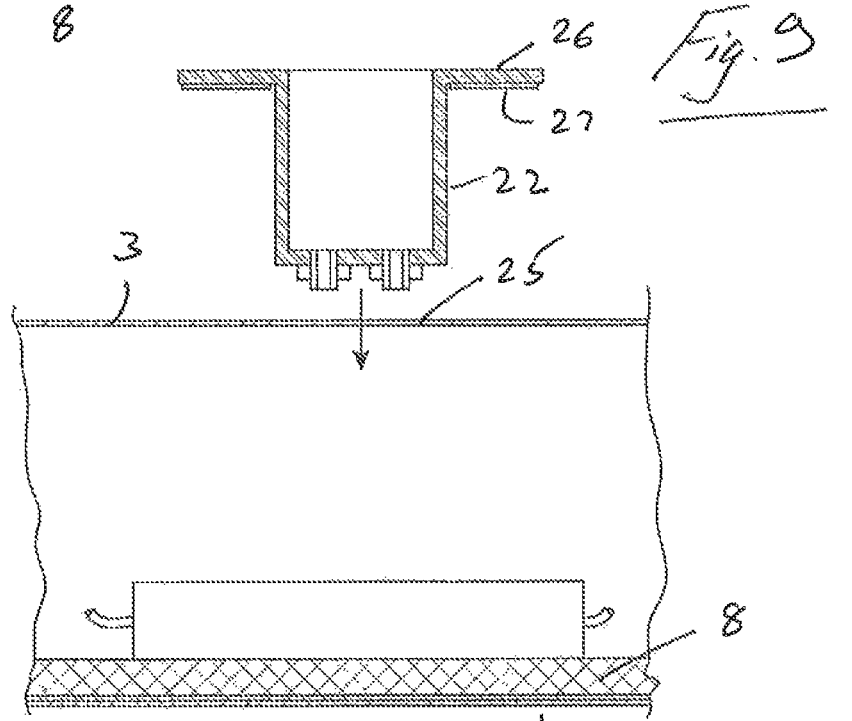

The composite panel comprises terminals 20, 21 for connecting to an external inverter (not shown). The terminals 20, 21 are in this case provided in a housing 22 which extends through a hole 25 in the backing sheet 3 of the composite panel. The housing 22 has an enlarged flange portion 26 which is engagable with the exposed surface of the internal sheet 3. Alternatively or additionally, the flange 26 may have an adhesive such as a double sided adhesive body or pad 27 to bond to the outer surface of the internal sheet 3. The housing 22 may also have a vent hole provided with a hydrophobic material As illustrated in FIG. 6 the external sheet 2 may comprise a plurality of spaced-apart cut-away openings, each having a photovoltaic solar collector module 8 mounted therein. The photovoltaic solar collector modules 8 may be electrically interconnected internally as illustrated.

The panel of the invention has the advantage that a large amount of photovoltaic material is provided. This is important, not only in providing manufacturing efficiencies, but also in ensuring that the maximum practical amount of the face of the panel exposed to sunlight is covered by photovoltaic material. At the same time panel side overlap features are provided for underlapping with like panels for ease of assembly, on site.

In the method for manufacturing a composite insulated panel of the invention a rectilinear hole 7 is cut in the external sheet 2 to accommodate a photovoltaic solar collector module 8. The external sheet is placed external face down, for example in a mould 50. The solar collector module 8 is then inserted into the cut-out hole 7. The solar collector module 8 is sealed to the external sheet using the sealant 10. A hole 25 is cut in the backing sheet 3 to receive the connector housing. Electrical connections are lead from the solar collector module 8 through the connector housing 22. The backing sheet 3 is applied over and spaced above the external sheet 2. Finally, a body of insulating material is provided between the inner face of the internal sheet 3 and the inner face of the external sheet 2 and the inner face of the photovoltaic solar collector 8. In this case the body 4 of insulation material is provided by injecting liquid foam reactants between the inner faces of the backing sheet 3 and the inner faces of the external sheet 2 and the solar collector module 8.

The method may comprise the steps of profiling the side edges of the external sheet 2 to form the first longitudinally extending raised projection 11 at one side of the panel and the second longitudinally extending raised projection 12 at an opposite side edge of the panel leaving a substantially flat portion 9 extending between the first and second raised projections. The profiling may be performed before or after the hole 7 to accommodate the solar collector module 8 is cut out.

On site, a number of the insulating panels are jointed together and the solar collector modules of adjacent panels may be interconnected.

One advantage of the composite panel of the invention is that a photovoltaic material is incorporated as part of the manufacturing process. Thus, no additional work is required on site—the panel is fitted in exactly the same manner as a conventional composite panel. Because the connector is integrated into the panel during manufacture, no roof access is required for electrical interconnection on site. This ensures a safe working environment and reduces costs considerably as safety barriers such as roof edge protectors are not required. Electrical interconnection is internal and not exposed to weathering. Electrical interconnection can be done at the same time as the building electrical fit out, thus saving costs and time. There is no risk of wire fouling during future roof maintenance. No external cable trays are required, again reducing material and labour costs. Further interconnection maintenance is facilitated from the inside of the building, no roof access is required. Because the photovoltaic panel is integrated, on manufacture transportation and packaging costs are minimised as the manufactured panel is transported as a single unit. Because frames are not required to mount the photovoltaic panel the unit is robust but light in weight. There is less fixing penetration required on the roof and the total system can be fully guaranteed. It provides a one stop contact for cladding and photovoltaic.

The photovoltaic roofing panels of the invention may be connected to an electrical system using known technologies.

It will be appreciated that the invention may be applied to a wide range of panels including roof panels, wall panels, and/or floor panels. Maximum solar efficiency is however generally achieved by covering south facing portions of a building with roof panels of the invention.

The panels may be used to construct part of or all of the building envelope including part or all of one or more of the roof, walls and floor. The side overlap and underlap projections may be used to overlap with any panels (having a photovoltaic solar collector function or not) which have side overlap/underlap features of the same profile as those of the panel of the invention.

Various aspects described with reference to one embodiment may be utilised, as appropriate, with another embodiment.

Many variations on the embodiments described will be readily apparent. Accordingly the invention is not limited to the embodiments hereinbefore described which may be varied in detail.

The invention claimed is:

1. A method for manufacturing a composite insulated panel comprising the steps of:
providing a first sheet;
cutting a hole in the first sheet to accommodate a photovoltaic solar collector module;
inserting the solar collector module into and through the hole;
sealing the solar collector module about its periphery to the first sheet;
providing a second sheet, the second sheet having an opening therein to receive a connector housing;
providing the connector housing extending through the opening in the second sheet;
leading electrical connections from the solar collector module through the connector housing; and
providing a body of insulating material between an inner face of the second sheet and an inner face of the first sheet and an inner face of the photovoltaic solar collector module.

2. The method as claimed in claim 1 wherein the body of insulation material is provided by injecting liquid foam reactants between the inner faces of the second sheet, the first sheet and the solar collector module.

3. The method as claimed in claim 1, further comprising the steps of profiling side edges of the first sheet to form a first longitudinally extending raised projection at one side of the panel and a second longitudinally extending raised projection at an opposite side of the panel leaving a substantially flat portion extending between the first and second raised projections and mounting the solar collector module in the hole in the substantially flat portion.

4. The method according to claim 3, wherein an outer face of the solar collector module is substantially co-planar with an outer face of the substantially flat portion of the first sheet.

5. The method of claim 1, wherein the first sheet comprises a plurality of spaced-apart cut-away holes, each having a photovoltaic solar collector module mounted therein.

6. The method of claim 5, wherein the cut-away holes are longitudinally spaced-apart along the panel.

7. The method according to claim 6, wherein the cut-away holes are transversely spaced-apart across the panel.

8. The method according to claim 5, wherein the photovoltaic solar collector modules are electrically interconnected.

9. The method according to claim 1 further comprising providing terminals for connecting to an inverter.

10. The method of claim 9 wherein the terminals are provided in a housing which extends through the second sheet of the composite panel.

11. The method of claim 1 wherein the first sheet has a first longitudinally extending raised projection at one side of the panel and a second longitudinally extending raised projection at an opposite side of the panel, the first raised projection comprising a side underlap projection and the second raised projection comprising a side overlap projection for jointing adjacent panels, the first and/or second sheet comprising a male projecting part and a female recess part for jointing adjacent panels.

12. The method of claim 1 wherein the body of insulating material comprises a foam such as a polyisocyanurate foam material or a phenolic foam material.

13. The method of claim 1 wherein the first sheet comprises a metallic material such as steel and wherein the second sheet comprises a metallic material such as steel.

* * * * *